(12) United States Patent
Khor et al.

(10) Patent No.: US 10,218,358 B2
(45) Date of Patent: Feb. 26, 2019

(54) METHODS AND APPARATUS FOR UNLOADING DATA FROM A CONFIGURABLE INTEGRATED CIRCUIT

(71) Applicant: Intel Corporation, Santa Clara, CA (US)

(72) Inventors: Kok Wah Khor, Nibong Tebal (MY); Eng Ling Ho, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/625,897

(22) Filed: Jun. 16, 2017

(65) Prior Publication Data

US 2018/0367147 A1    Dec. 20, 2018

(51) Int. Cl.
H03K 19/177    (2006.01)

(52) U.S. Cl.
CPC ... *H03K 19/17756* (2013.01); *H03K 19/1776* (2013.01)

(58) Field of Classification Search
CPC ............ H03K 19/17756; H03K 19/1776
See application file for complete search history.

(56) References Cited

U.S. PATENT DOCUMENTS

| | | | |
|---|---|---|---|
| 5,210,749 A | 5/1993 | Firoozmand | |
| 6,717,436 B2* | 4/2004 | Kress | H03K 19/17732 326/38 |
| 7,218,137 B2* | 5/2007 | Vadi | H03K 19/17732 326/38 |
| 7,535,254 B1* | 5/2009 | Case | H03K 19/17732 326/39 |
| 7,594,002 B1 | 9/2009 | Thorpe et al. | |
| 7,869,355 B2 | 1/2011 | Kodama et al. | |
| 8,229,918 B2 | 7/2012 | Branscome et al. | |
| 8,415,974 B1* | 4/2013 | Lysaght | H03K 19/17756 326/39 |
| 9,383,802 B1* | 7/2016 | Tan | G06F 1/3203 |
| 9,712,186 B1* | 7/2017 | Schulz | H04L 1/1829 |
| 2007/0019661 A1 | 1/2007 | Rowett et al. | |
| 2008/0104601 A1 | 5/2008 | Kaneko et al. | |
| 2014/0101411 A1* | 4/2014 | Sakarda | G06F 9/4893 712/42 |
| 2016/0048458 A1 | 2/2016 | Lutas et al. | |
| 2016/0049941 A1* | 2/2016 | How | H03K 19/007 326/9 |
| 2017/0103157 A1* | 4/2017 | Hutton | G06F 17/5027 |

* cited by examiner

*Primary Examiner* — Alexander H Taningco
*Assistant Examiner* — Kurtis R Bahr
(74) *Attorney, Agent, or Firm* — Treyz Law Group, P.C.; Jason Tsai

(57) ABSTRACT

A system may include a host processor and a coprocessor for accelerating tasks received from the host processor. The coprocessor may include programmable circuitry organized into logic sectors. Each logic sector may have a dedicated local sector manager (LSM). The LSMs may be controlled by a secure device manager (SDM). The SDM may be coupled to data unloading circuitry for unloading configuration data from the coprocessor off onto the host processor. The unloading circuitry may include a circular first-in first-out (FIFO) buffer circuit that can be divided into multiple partitions to store configuration data from the various LSMs. The FIFO buffer circuit may be configured as an input FIFO in a configuration (loading) mode or as an output FIFO in a data unloading mode.

20 Claims, 8 Drawing Sheets

METHODS AND APPARATUS FOR UNLOADING DATA FROM A CONFIGURABLE INTEGRATED CIRCUIT

BACKGROUND

This relates to integrated circuits and, more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements on a programmable integrated circuit to configure the device to perform the functions of the custom logic circuit.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration. Sometimes, only a subset of the configuration data is loaded during a process known as partial reconfiguration.

Programmable devices may be used for co-processing in big-data or fast-data applications. For example, programmable devices may be used in application acceleration tasks in a datacenter and may be reprogrammed during datacenter operation to perform different tasks. Oftentimes, an active configuration of a programmable device could be a result of many partial reconfiguration events that is difficult to track or tedious to repeat.

It is within this context that the embodiments herein arise.

DETAILED DESCRIPTION

The present embodiments relate to integrated circuits and, more particularly, to programmable integrated circuits. It will be recognized by one skilled in the art, that the present exemplary embodiments may be practiced without some or all of these specific details. In other instances, well-known operations have not been described in detail in order not to unnecessarily obscure the present embodiments.

Programmable integrated circuits use programmable memory elements to store configuration data. Configuration data may be generated based on source code corresponding to application-specific tasks to be performed in parallel on the programmable integrated circuit. During programming of a programmable integrated circuit, configuration data is loaded into the memory elements. The memory elements may be organized in arrays having numerous rows and columns. For example, memory array circuitry may be formed in hundreds or thousands of rows and columns on a programmable logic device integrated circuit.

During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

A programmable integrated circuit can sometimes be configured as an accelerator circuit to efficiently perform parallel processing tasks. The accelerator circuit may include multiple columns of soft processors of various types that are specialized for different types of parallel tasks. The accelerator circuit may be dynamically reconfigured to optimally assign and perform the parallel tasks.

Figure 1:
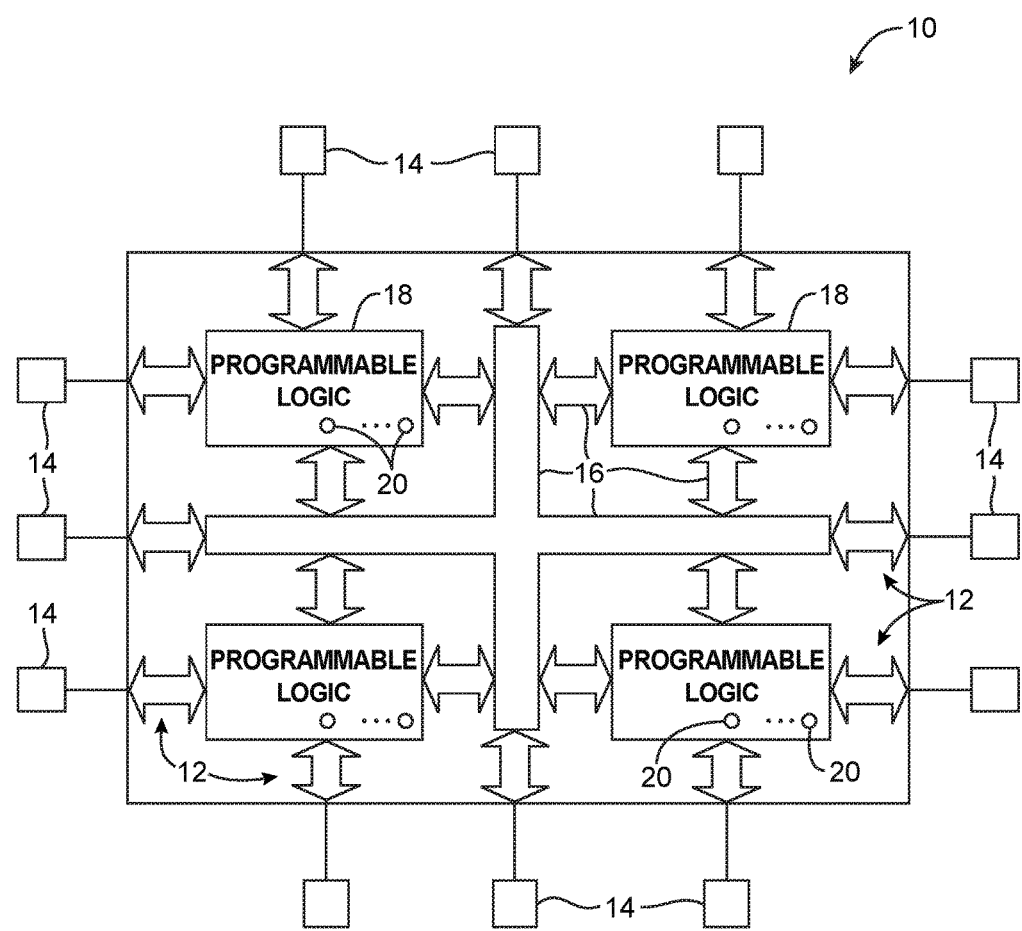
FIG. 1 is a diagram of an illustrative programmable integrated circuit in accordance with an embodiment.

An illustrative programmable integrated circuit such as programmable logic device (PLD) 10 is shown in FIG. 1. As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements 20 may each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
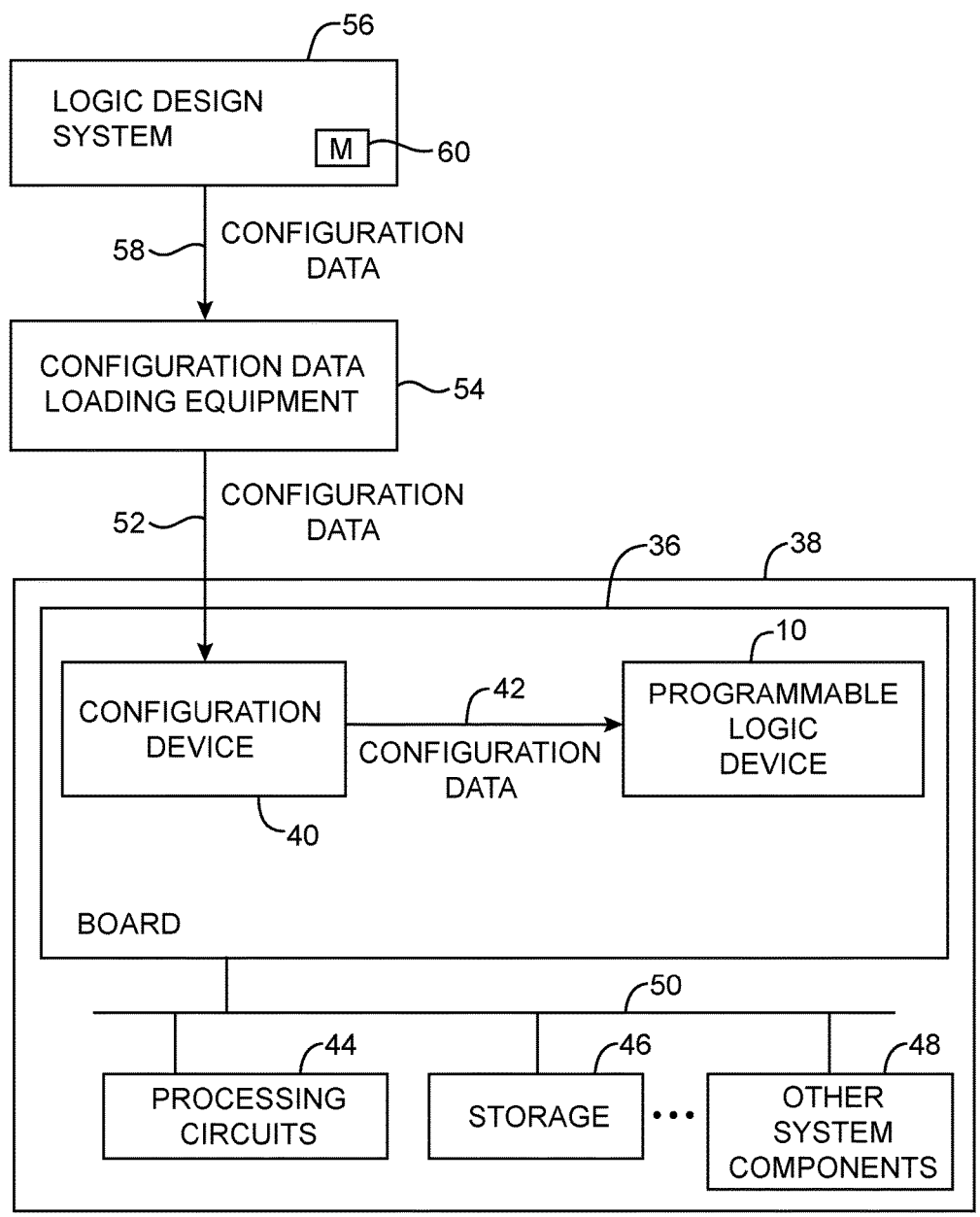
FIG. 2 is a diagram showing how configuration data is created by a logic design system and loaded into a programmable device to configure the device for operation in a system in accordance with an embodiment.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10.

Circuit 40 may be an erasable-programmable read-only memory (EPROM) chip, a programmable logic device configuration data loading chip with built-in memory (sometimes referred to as a "configuration device"), or another suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses, traces, and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. Logic design system 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data, which is provided to configuration device 40. Upon power-up, configuration device 40 and data loading circuitry on programmable logic device 10 is used to load the configuration data into CRAM cells 20 of device 10. Device 10 may then be used in normal operation of system 38.

After device 10 is initially loaded with a set of configuration data (e.g., using configuration device 40), device 10 may be reconfigured by loading a different set of configuration data. Sometimes it may be desirable to reconfigure only a portion of the memory cells on device 10 via a process sometimes referred to as "partial reconfiguration." As memory cells are typically arranged in an array, partial reconfiguration can be performed by writing new data values only into selected portion(s) in the array while leaving portions of array other than the selected portion(s) in their original state.

Figure 3:
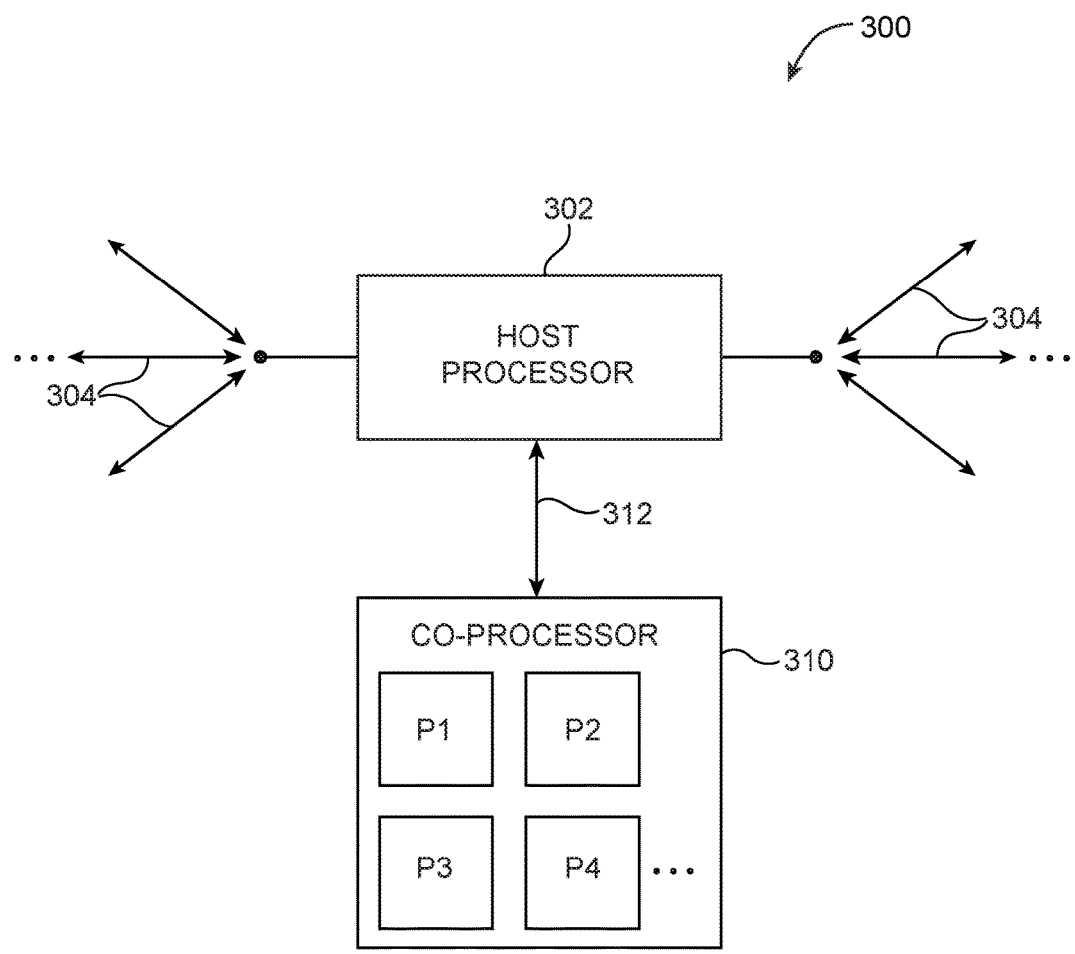
FIG. 3 is a diagram showing how a programmable integrated circuit may be used as a coprocessor in support of a host processor in accordance with an embodiment.

Partial reconfiguration may be a particularly useful feature when developing an acceleration platform. For example, consider a scenario in which a system such as system 300 includes a host processor 302 that is coupled to other network components via paths 304 (see, e.g., FIG. 3). As shown in FIG. 3, host processor 302 may be coupled to a coprocessor such as coprocessor 310 (sometimes referred to herein as an accelerator circuit) via path 312. Accelerator circuit 310 may be a programmable integrated circuit such as device 10 of FIG. 1. Alternatively, the programmable integrated circuit may include multiple accelerator circuit blocks. Accelerator circuit 310 may include various processing nodes (sometimes referred to as processor "cores") such as cores P1-P4 to help accelerate the performance of host processor 302. Processing cores P1-P4 may be soft processor cores that are configurable. In some instances, cores P1-P4 may be implemented as discrete logic regions sometimes referred to as "logic sectors" or "logic regions" on circuit 310.

Configured as such, accelerator circuit 310 may sometimes be referred to as a "hardware accelerator." As examples, the processing cores on coprocessor 310 may be used to accelerate a variety of functions, which may include but are not limited to: encryption, Fast Fourier transforms, video encoding/decoding, convolutional neural networks (CNN), firewalling, intrusion detection, database searching, domain name service (DNS), load balancing, caching network address translation (NAT), and other suitable network packet processing applications, just to name a few.

Figure 4:
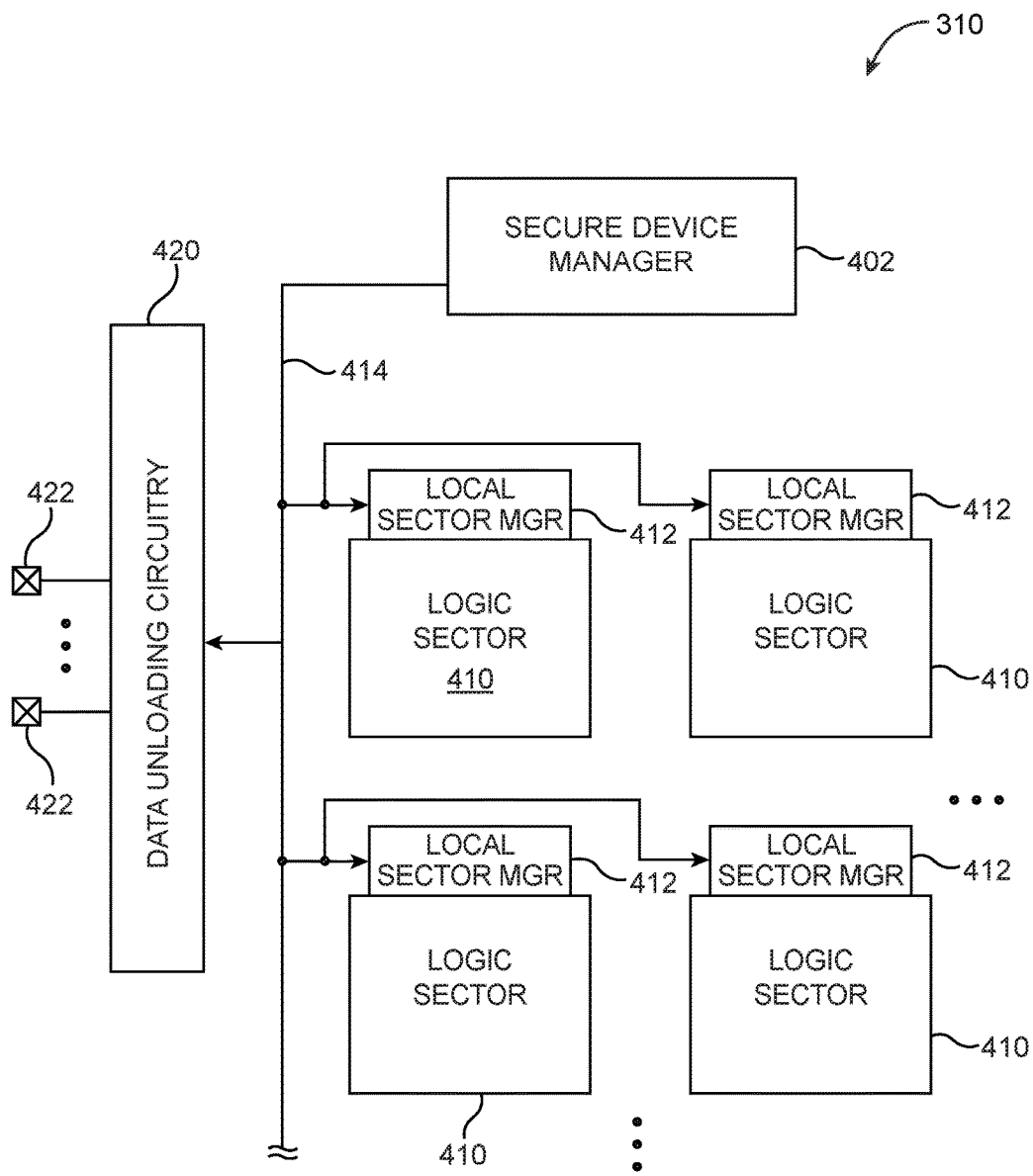
FIG. 4 is a diagram of an illustrative programmable integrated circuit having multiple logic sectors controlled by local sector managers and a secure device manager in accordance with an embodiment.

For instances in which cores P1-P4 are implemented as logic sectors in accelerator circuit 310, each logic sector may be managed using local sector managers (see, e.g., FIG. 4). As shown in FIG. 4, accelerator integrated circuit device 310 may include multiple logic sectors 410 (sometimes referred to as logic regions). Each logic sector 410 may be managed by a respective local sector manager (LSM) 412. Local sector managers 412 (sometimes referred to as logic region manager circuits) may be controlled by a secure controller such as secure device manager (SDM) 402. Secure device manager 402 may receive configuration data (e.g., configuration bit streams) and/or accelerator requests from a host processor (e.g., host processor 302 of FIG. 3). Secure device manager 402 may then provide the received commands, configuration data, and acceleration requests to local sector managers 412 over a bus 414. Bus 414 coupling secure device manager 402 to local sector managers 412 may sometimes be referred to as a configuration network-on-chip (CNoC).

In some instances, the received configuration data and accelerator requests may optionally be compressed and encrypted. Thus, secure device manager 402 or some other configuration circuit on device 310 may include a decompression and decryption circuit (not shown) for decompressing and decrypting data received from the host processor.

Logic sectors 410 may be individually configurable or programmable using the associated local sector manager 412. This allows each of logic sectors 410 to independently process different tasks in parallel. The parallel processing enabled by logic sectors 410 may be utilized to perform application acceleration (e.g., in a datacenter) for a variety of tasks or jobs simultaneously by reconfiguring different subsets of the logic sectors to perform the different tasks.

In order to efficiently manage application acceleration as new tasks are issued to accelerator circuit 310 from the host processor, it may be necessary to perform real-time reconfiguration on one or more logic sectors 410 that will be used to process a given newly received task. In other words, reconfiguration of logic sectors 410 may be performed while accelerator circuit 310 is running and may be performed without interrupting the operation of accelerator circuit 310 via a process known as partial reconfiguration. As a result, an active configuration of a programmable device could be a result of many partial reconfiguration events that is difficult to track or tedious to repeat.

In accordance with an embodiment, accelerator device 310 may be provided with data unloading circuitry such as data unloading circuitry 420 that is configured to offload configuration data from logic sectors 410 to external pins such as pins 422. Pins 422 may be coupled to the corresponding host processor (e.g., host processor 302 in FIG. 3). Unloading data from device 310 onto the host processor can help with configuration image capture, debugging, hibernation, and other suitable operations that require storing the current configuration state of device 310.

Conventional unloading operations rely on an asynchronous level trigger request that is sent to the programmable device. The asynchronous level trigger event is exceedingly slow and non-continuous.

Figure 5:
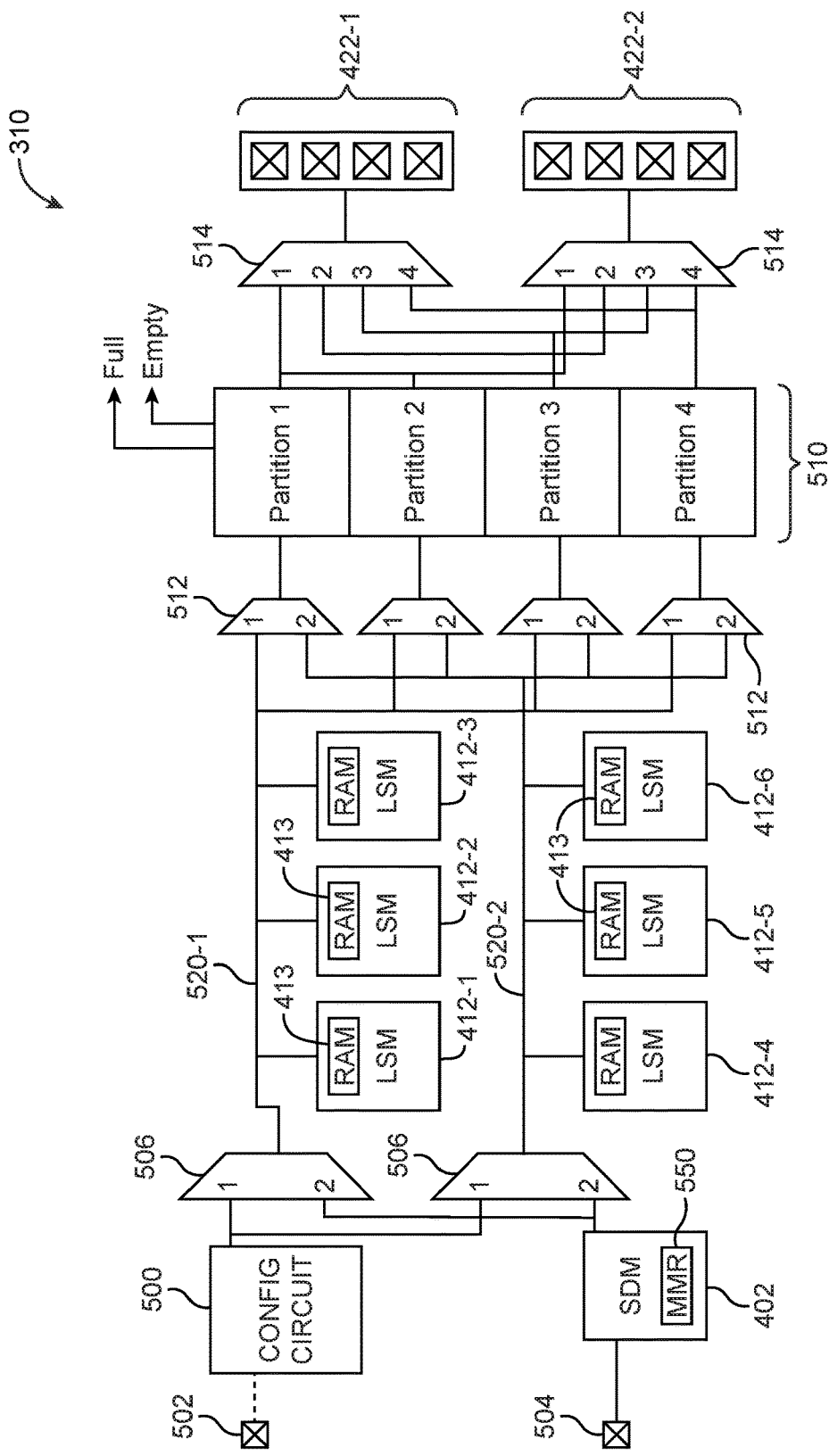
FIG. 5 is a diagram showing an illustrative configurable buffer circuit that can be used to perform continuous configuration data unloading operations in accordance with an embodiment.

The present embodiments are directed towards a synchronous data unload to the external host processor using a circular buffer that operates at the system clock frequency and software-assisted transport that is handled by the secure device manager. FIG. 5 is a diagram showing an illustrative configurable buffer circuit that can be used to perform continuous configuration data unloading operations in accordance with an embodiment. A "circular" buffer may be a FIFO circuit that stores data in a first-in first-out fashion, but when the last entry is filled, the next incoming data is stored in the first entry. In other words, a write pointer will keep cycling through the FIFO entries in a circular fashion. For example, new incoming data will be stored in the first entry if the first entry is empty (i.e., if the data is already read out or retrieved). The new data will not overwrite the old data if the old data has not been read and will wait until there is an empty slot in the FIFO to write it in.

As shown in FIG. 5, local sector managers 412 may be coupled to secure device manager 402 via multiplexer 506, may be coupled to configuration circuit 500 via multiplexer 506, and may be coupled to circular buffer circuit 510 via multiplexers 512. The logic sectors associated with each local sector manager 412, which are shown in FIG. 4, are omitted from FIG. 5 so as to avoid unnecessarily obscuring the present embodiments. Circular buffer 510 may be a configurable first-in first-out (FIFO) circuit, as an example, and may be coupled to various sets of output pins 422 via multiplexers 514.

Multiplexers 506 may each have a first input that is coupled to configuration circuit 500, a second input that is coupled to secure device manager 402, and an output that is coupled to different groups of local sector managers 412. In the example of FIG. 5, the top multiplexer 506 may be coupled to a first group of local sector managers 412-1, 412-2, and 412-3, and the bottom multiplexer 506 may be coupled to a second group of local sector managers 412-4, 412-5, and 412-6. Configured in this way, secure device manager 402 may receive user commands (e.g., a Joint Test Action Group or "JTAG" command) via external pin(s) 504 and may send corresponding unloading commands to local sector managers 412 by configuring each multiplexer 506 to route signals from its second input to its output. Configuration circuit 500 may receive configuration data from external pin(s) 502 and may provide the configuration data to one or more logic sector manger 412 for programming any portion of the logic sectors by configuration each multiplexer 506 to route signals from its first input to its output.

Each local sector manager 412 may include a local random-access memory (RAM) 413 for temporarily storing the configuration data for the associated logic sector. The configuration data stored in this way may be offloaded to FIFO circuit 510 via multiplexers 512. In the example of FIG. 5, FIFO circuit 510 may be divided into four different partitions. A first multiplexer 512 may have a first input that is coupled to the first group of LSMs (e.g., LSMs 412-1, 412-2, and 412-3), a second input that is coupled to the second group of LSMs (e.g., LSMs 412-4, 412-5, and 412-6), and an output that is coupled to the first partition of FIFO 510. A second multiplexer 512 may have a first input that is coupled to the first group of LSMs, a second input that is coupled to the second group of LSMs, and an output that is coupled to the second partition of FIFO 510. A third multiplexer 512 may have a first input that is coupled to the first group of LSMs, a second input that is coupled to the second group of LSMs, and an output that is coupled to the third partition of FIFO 510. A fourth multiplexer 512 may have a first input that is coupled to the first group of LSMs, a second input that is coupled to the second group of LSMs, and an output that is coupled to the fourth partition of FIFO 510.

Configured in this way, data may be conveyed from one of the LSMs in the first group to one of the partitions via data bus 520-1 and from one of the LSMs in the second group to another one of the partitions via data bus 520-2 in parallel. Each partition may be capable of outputting a full status signal (indicating that the particular partition is full and cannot take on more data) and an empty status signal (indicating that the particular partition is empty and is ready to buffer data). The full and empty status signals may be generated based on a write pointer and a read pointer for each FIFO partition. If the write and read pointers are pointing at the same address location, then the FIFO may be considered empty. If the write pointer is one address location behind the read pointer, then the FIFO may be considered full. Since FIFO circuit 510 is a circular buffer, a write pointer pointing at the bottom of a FIFO partition and an associated read pointer pointing at the top of that FIFO partition will also indicate a full status.

Multiplexers 512 may be configured to route configuration data stored in FIFO circuit 510 onto external pins 422 (sometimes referred to as "test pins"). In the example of FIG. 5, a first multiplexer 512 may have four inputs coupled to the four different partitions of FIFO 510 and an output that is coupled to a first set of test pins 422-1. Similarly, a second multiplexer 512 may have four inputs coupled to the four different partitions of FIFO 510 and an output that is coupled to a second set of test pins 422-2. Configured in this way, test pins 422-1 may receive unloaded configuration data from a selected one of the multiple partitions via first multiplexer 514, and test pins 422-2 may receive unloaded configuration from a selected one of the multiple partitions via second multiplexer 514.

The example of FIG. 5 in which FIFO circuit 510 is organized into four partitions is merely illustrative and is not intended to limit the scope of the present embodiments. If desired, circular FIFO circuit 510 may be grouped into fewer than four partitions or more than four partitions. Multiplexing circuitry 506, 512, and 514 and FIFO circuit 510 may all be considered to be part of data unloading circuitry 420 (see FIG. 4). Moreover, device 310 may include more than two groups of LSMs. For example, a device 310 that includes four different groups of LSMs may include at least four input switching multiplexers 506 and may have multiplexers 512 each with at least four different inputs for receiving data via four respective CNoC data buses 520. As another example, a device 310 that includes eight different groups of LSMs may include at least eight input switching multiplexers 506 and may have multiplexers 512 each with at least eight different inputs for receiving data via eight respective CNoC data buses 520.

As described above, the configuration data may be unloaded from each logic sector using local sector manager 412 when instructed by secure device manager 402. Secure device manager 402 may be configured to perform these operations using hardware (e.g., dedicated hardware or circuitry) and/or software (e.g., code that runs on the hardware of device 310). Software or firmware code for performing these operations may be stored on non-transitory computer readable storage media (e.g., tangible computer readable storage media). The software/firmware code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, other computer readable media, or combinations of these computer readable media or other storage. Software/firmware stored on the non-transitory computer readable storage media may be executed by secure device manager 402.

Secure device manager 402 may be configured to control multiplexers 506, 512, and 514 to coordinate the data unloading operations using memory-mapped register (MMR) 550 and can be referred to as a main/master controller circuit, which is controlled synchronously by a system clock. The unloaded data may be stored temporarily at the local RAM 413 and can then be sent to FIFO 5150 for buffering via CNoC buses 520. To maximize data throughout (i.e., to optimize unloading speed), FIFO circuit 510 may be divided into multiple partitions. Secure device manager 402 may determine to which partition a particular LSM should send its data. Once a LSM has completed its data transfer, secure device manager 402 may instruct the next LSM in that group to send out its data to a different partition.

As described above, there are multiple configurable input and output paths for each FIFO partition. The input path to each FIFO partition can be selected using multiplexer 512 to route signals from a selected one of the internal data CNoC paths 520 and multiple groups can be unloaded in parallel. Once a partition is full, an interrupt signal (e.g., the "Full" status signal) may be output to secure device manager 402. In response, secure device manager 402 may send out an instruction to the next LSM in the group to transmit its unloaded configuration data while setting up the next FIFO partition so that it can receive data from the next LSM. In general, only one LSM in each group of LSMs may be unloaded at any given point in time since the LSMs in each group share a common CNoC bus 520.

Turning to the output path, each FIFO partition may be routed to different sets of device pins 422 using multiplexers 514. This will enable parallel unload of different LSM configuration data for the host processor or other external tester device. Once a FIFO partition goes empty, an interrupt signal (e.g., the "Empty" status signal) may be output to secure device manager 402. In general, secure device manager 402 may configure the output path in one of two modes using memory-mapped register 550.

The first mode is an auto partition switching scheme in which secure device manager 402 sets (during the partition setup phase) a predetermined sequence of FIFO partitions to be automatically switched. No direct input is needed from the secure device manager for the partition switching to take place. For example, once a first FIFO partition goes empty, the hardware will automatically switch to a second FIFO partition for the output path and so on, and will circle back up to the top of FIFO 510 once the bottom partition is empty. The first mode will maximize data throughput with minimal wait time for the external device receiving the offloaded configuration data.

The second mode is a software interrupt mode. In the software interrupt mode, once the FIFO partition goes empty, the FIFO empty interrupt signal will be output to secure device manager 402. In response, secure device manager 402 will actively decide which partition to switch to next. Thus, the sequence of partition switching is determined by the software/firmware that controls secure device manager 402. In contrast to the first mode, the second mode will provide more flexibility since the software/firmware can perform dynamic switching.

Figure 6:
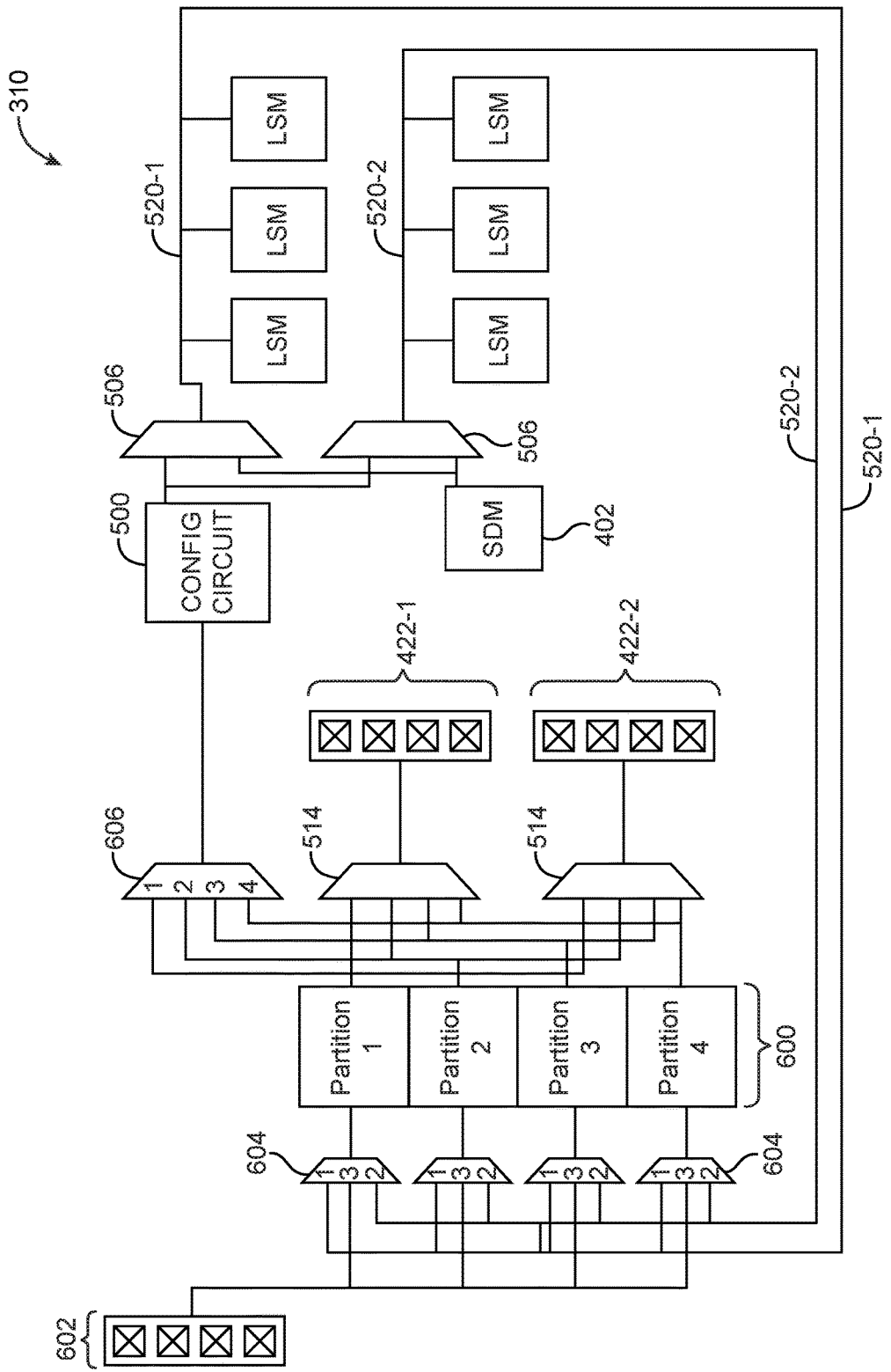
FIG. 6 is a diagram showing an illustrative dual-function configurable buffer circuit that can be used to perform continuous configuration data unloading operations and configuration data loading operations in accordance with an embodiment.
Figure 7:
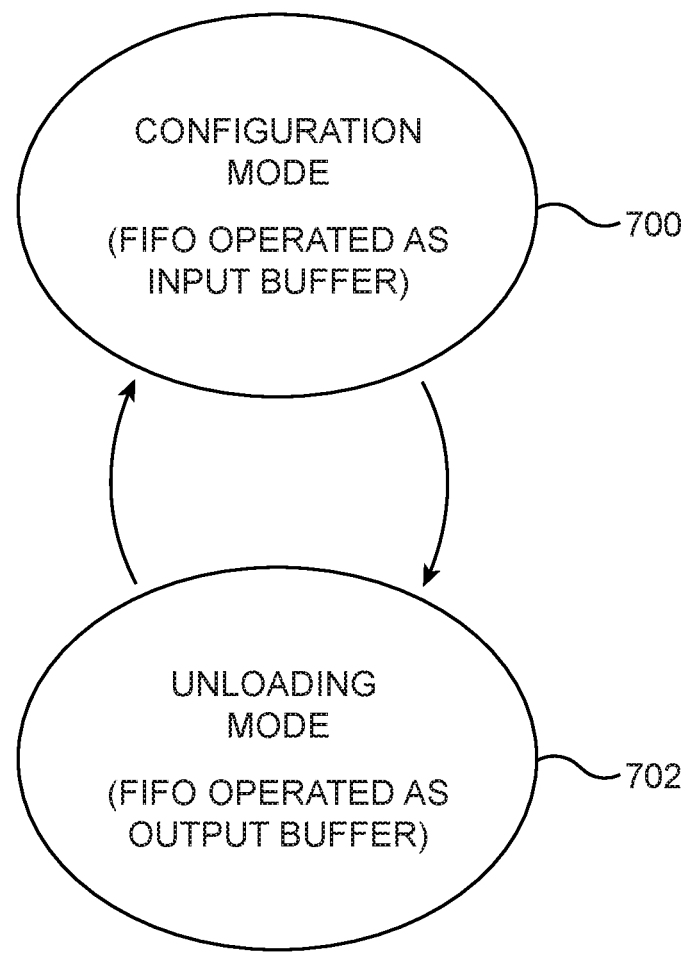
FIG. 7 is a diagram showing how a configurable buffer circuit may be operable in two modes in accordance with an embodiment.

The arrangement of FIG. 5 may be optimized for output streaming (i.e., for offloading data from the LSMs to external pins 422). In accordance with another suitable arrangement, a circular buffer may be configured as a dual-function FIFO circuit that is further optimized as an input buffer (see, e.g., FIG. 6). As shown in FIG. 6, a circular buffer such as dual-mode FIFO circuit 600. FIFO circuit 600 may be operable as an input FIFO in a configuration (or data load) mode 700 and as an output FIFO in a data unloading mode 702 (see FIG. 7).

Referring back to FIG. 6, FIFO circuit 600 may be coupled to external pins 602 via multiplexers 604. External pins 602 may serve as configuration input pins for receiving new configuration data. In the example of FIG. 6, Each multiplexer 604 may have a first input that is coupled to the first group of LSMs via bus 520-1, a second input that is coupled to the second group of LSMs via bus 520-2, a third input that is coupled to configuration input pins 602, and an output that is coupled to a corresponding FIFO partition. Multiplexers 506 and 514 are arranged in the same configuration as FIG. 5, so the detailed structure and function need not be reiterated. Device 310 may further include a multiplexer 606 for routing the new configuration data received at FIFO circuit 600 to configuration circuit 500. Multiplexer 606 may transmit configuration data from the different FIFO partitions in a time-multiplexed fashion (e.g., by automatically switching through the various filled partitions).

Secure device manager 402 may also control multiplexers 604 and 606 using the memory-mapped registers. During configuration operations (mode 700 in FIG. 7), data is received at pins 602, buffered at FIFO 600, and then sent to configuration controller 600 via multiplexer 606. During unloading operations (mode 702 in FIG. 7), the SDM firmware will direct the LSMs to retrieve the desired configuration data. The retrieved data will then be sent and buffered at FIFO 600 and then output to external pins 422 via multiplexers 514. The host controller or other external processor can read the unload data directly through pins 422, which will drastically improve data throughput. Moreover, reusing the circular FIFO as an input FIFO can help save circuit area by reducing storage requirements.

Figure 8:
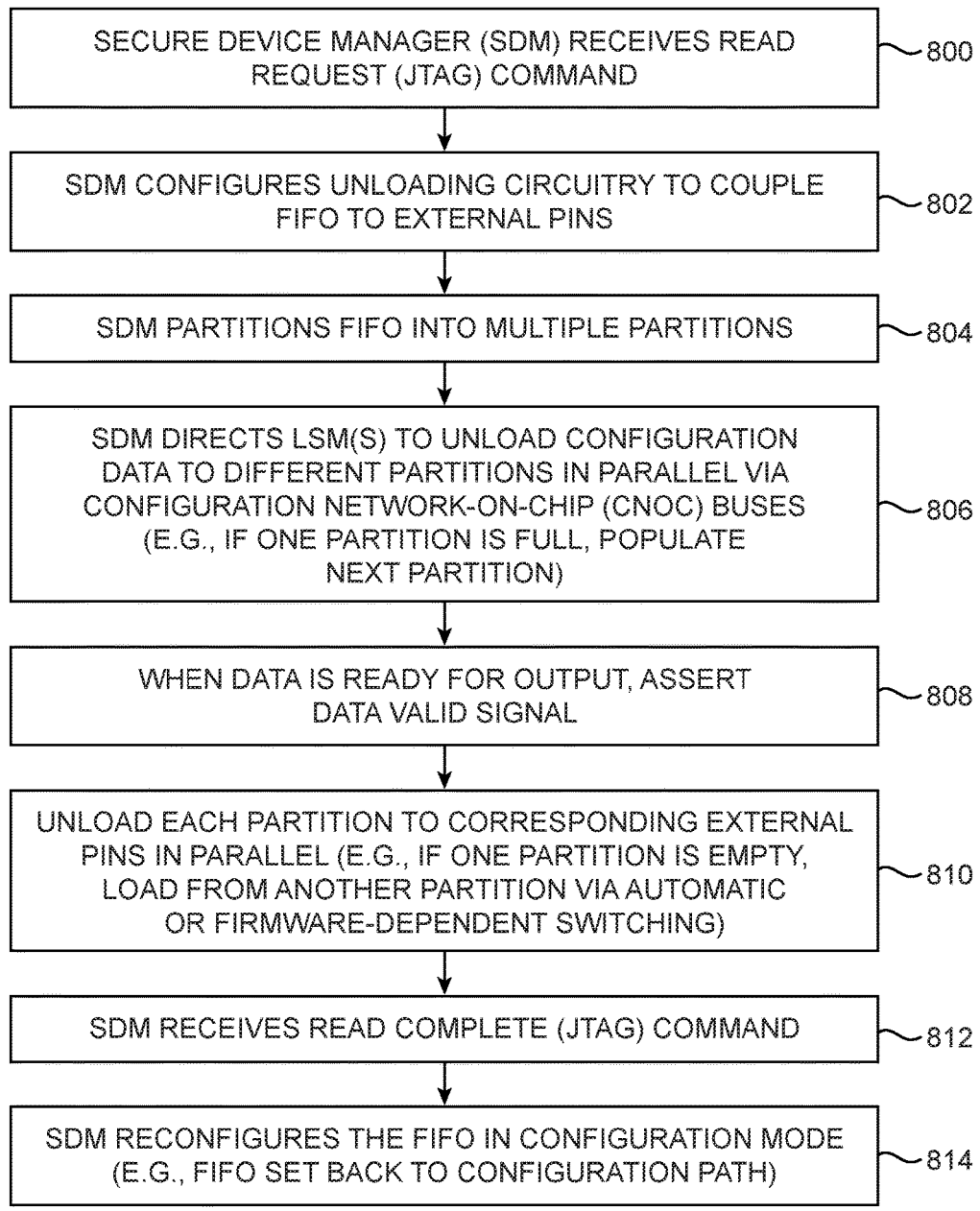
FIG. 8 is a flow chart of illustrative steps for operating a configurable buffer circuit to unload data from an integrated circuit in accordance with an embodiment.

FIG. 8 is a flow chart of illustrative steps for operating a configurable buffer circuit to unload data from accelerator device 310. At step 800, secure device manager 402 may receive a read request command (or unload command) via a JTAG protocol. At step 802, secure device manager 402 may configure the unloading circuitry to couple the circular FIFO to external pins 422. At step 804, secure device manager 402 may then divide the circular FIFO into multiple partitions and set up the routing path of different CNoC segments (e.g., CNoC buses 520-1 and 520-2 in FIG. 5) for the different partitions.

At step 806, secure device manager 402 may then direct local sector managers 412 to unload configuration data to the different partitions in parallel via the CNoC buses 520. Only one LSM in each group of LSMs that share a common CNoC bus can be offloaded onto the shared CNoC bus at any given point in time. If one FIFO partition is full, the next FIFO partition may be filled.

When data is read for output at the circular FIFO, a data valid signal may be asserted (step 808). At step 810, the multiple partitions may unload the stored configuration data to the different sets of external pins 422 in parallel. Each set of pins may only receive data from one partition at any given point in time. If one partition is emptied, multiplexers 514 may switch to offload data from another partition via an automatic switching mechanism or a firmware-dependent switching scheme.

At step 812, secure device manager 402 may receive a read complete command via the JTAG protocol. The JTAG commands may, for example, be issued by host processor 302 that is coupled to device 310 (see FIG. 3). At step 814, secure device manager 402 may then reconfigure the circular FIFO back to the configuration mode (e.g., mode 700 of FIG. 7). In general, secure device manager 402 may dynamically configure the circular FIFO along with the associated multiplexing circuitry in either configuration mode 700 or unloading mode 702, depending on the needs of the overall system.

These steps are merely illustrative and are not intended to limit the present embodiments. The existing steps may be modified or omitted; some of the steps may be performed in parallel; additional steps may be added; and the order of certain steps may be reversed or altered.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a plurality of logic regions; a controller circuit configured to transmit commands to the plurality of logic regions, the commands direct the plurality of logic regions to unload configuration data; a buffer circuit configured to receive the configuration data from the plurality of logic regions; and external pins that receive the configuration data from the buffer circuit.

Example 2 is the integrated circuit of example 1, optionally further comprising: a plurality of local region manager circuits associated with the plurality of logic regions, wherein each of the local region manager circuits includes memory for storing the configuration data to be unloaded.

Example 3 is the integrated circuit of example 2, optionally further comprising: a first multiplexer coupled between the controller circuit and the plurality of local region manager circuits; a configuration circuit for loading new configuration data into the plurality of logic regions; and a second multiplexer coupled between the controller circuit and the plurality of local region manger circuits.

Example 4 is the integrated circuit of example 3, wherein the controller circuit is optionally further configured to divide the buffer circuit into multiple partitions.

Example 5 is the integrated circuit of example 4, optionally further comprising: third multiplexers that are coupled between the buffer circuit and the external pins.

Example 6 is the integrated circuit of example 5, further comprising: a fourth multiplexer that is coupled between the buffer circuit and the configuration circuit.

Example 7 is the integrated circuit of examples 4-6, wherein a first group of logic regions in the plurality of logic regions is optionally coupled to a first data bus, and wherein a second group of logic regions in the plurality of logic regions is optionally coupled to a second data bus that is different than the first data bus.

Example 8 is the integrated circuit of example 7, optionally further comprising: additional multiplexers having inputs coupled to the first and second data buses and outputs coupled to the buffer circuit.

Example 9 is the integrated circuit of example 8, optionally further comprising: configuration input pins that are coupled to the inputs of the additional multiplexers.

Example 10 is the integrated circuit of examples 1-6, wherein the buffer circuit is optionally a configurable circular first-in first-out (FIFO) circuit.

Example 11 is a method of operating an integrated circuit, the method comprising: with a secure device manager, receiving an unload command; in response to receiving the unload command, using the secure device manager to configure unloading circuitry such that a buffer circuit in the unloading circuitry is coupled to external pins; and synchronously offloading data from a plurality of logic sectors to the external pins via the buffer circuit.

Example 12 is the method of example 11, optionally further comprising configuring the buffer circuit as an output first-in first-out (FIFO) circuit when offloading the data.

Example 13 is the method of example 12, optionally further comprising configuring the buffer circuit as an input FIFO circuit for receiving data to be loaded into the plurality of logic sectors.

Example 14 is the method of examples 11-13, optionally further comprising: dividing the buffer circuit into multiple partitions; and with the partitions of the buffer circuit, receiving data from the plurality of logic sectors in parallel.

Example 15 is the method of example 14, optionally further comprising: in response to determining that one of the partitions is full, directing the plurality of logic sectors to send data to another one of the partitions; and in response to determining that one of the partitions is empty, directing the buffer circuit to unload data from another one of the partitions.

Example 16 is a non-transitory computer-readable storage medium comprising instructions for: configuring a set of multiplexers so that a buffer circuit is coupled to external pins; dividing the buffer circuit into multiple partitions; and directing a plurality of local sector managers to offload configuration data to the external pins via the buffer circuit, wherein the local sector managers offload the configuration data to the multiple partitions of the buffer circuit in parallel.

Example 17 is the non-transitory computer-readable storage medium of example 16, optionally further comprising instructions for: receiving a Joint Test Action Group (JTAG) read request command.

Example 18 is the non-transitory computer-readable storage medium of example 16, optionally further comprising instructions for: directing a first selected local sector manager in a first group of the local sector managers to send its configuration data to one of the multiple partitions via a first data bus; and directing a second selected local sector manager in a second group of the local sector managers to send its configuration data to another one of the multiple partitions via a second data bus that is different than the first data bus.

Example 19 is the non-transitory computer-readable storage medium of example 18, optionally further comprising instructions for: directing additional multiplexers to route the configuration data from the first and second data buses to the corresponding partitions in the buffer circuit.

Example 20 is the non-transitory computer-readable storage medium of example 16-19, optionally further comprising instructions for: configuring the buffer circuit as an input first-in first-out (FIFO) circuit in a configuration mode for loading new configuration data into the plurality of local sector managers; and configuring the buffer circuit as an output first-in first-out (FIFO) circuit in an unloading mode during which the plurality of local sector managers offload the configuration data to the external pins via the buffer circuit.

Example 21 is an integrated circuit, comprising: a plurality of logic sectors; means for controlling the plurality of logic sectors; and means for synchronously unloading configuration data from the means for controlling the plurality of logic sectors to external pins.

Example 22 is the integrated circuit of example 21, wherein the means for controlling the plurality of logic sectors optionally comprises means for storing the configuration data.

Example 23 is the integrated circuit of example 21, optionally further comprising: means for receiving an unload command and for configuring the means for synchronously unloading the configuration data in response to receiving the unload command.

Example 24 is the integrated circuit of examples 21-23, wherein the means for synchronously unloading the configuration data optionally comprises means for temporarily buffering the configuration data in a plurality of partitions.

Example 25 is the integrated circuit of example 24, wherein the means for synchronously unloading the configuration data optionally further comprises: first means for selectively coupling the means for controlling the plurality of logic sectors to the plurality of partitions; and second means for selectively coupling the plurality of partitions to the external pins.

The foregoing is merely illustrative of the principles of this disclosure and various modifications can be made by those skilled in the art. The foregoing embodiments may be implemented individually or in any combination.

What is claimed is:

1. An integrated circuit, comprising:
    a plurality of logic regions;
    a controller circuit configured to transmit commands to the plurality of logic regions, the commands direct the plurality of logic regions to unload configuration data;
    a buffer circuit configured to receive the configuration data from at least two logic regions in the plurality of logic regions; and
    external pins that receive the configuration data from the buffer circuit.

2. The integrated circuit of claim 1, further comprising:
    a plurality of local region manager circuits associated with the plurality of logic regions, wherein each of the local region manager circuits includes memory for storing the configuration data to be unloaded.

3. The integrated circuit of claim 2, further comprising:
    a first multiplexer coupled between the controller circuit and the plurality of local region manager circuits;
    a configuration circuit for loading new configuration data into the plurality of logic regions; and
    a second multiplexer coupled between the controller circuit and the plurality of local region manger circuits.

4. The integrated circuit of claim 3, wherein the controller circuit is further configured to divide the buffer circuit into multiple partitions.

5. The integrated circuit of claim 4, further comprising:
    third multiplexers that are coupled between the buffer circuit and the external pins.

6. The integrated circuit of claim 5, further comprising:
    a fourth multiplexer that is coupled between the buffer circuit and the configuration circuit.

7. The integrated circuit of claim 4, wherein a first group of logic regions in the plurality of logic regions is coupled to a first data bus, and wherein a second group of logic regions in the plurality of logic regions is coupled to a second data bus that is different than the first data bus.

8. The integrated circuit of claim 7, further comprising:
additional multiplexers having inputs coupled to the first and second data buses and outputs coupled to the buffer circuit.

9. The integrated circuit of 8, further comprising:
configuration input pins that are coupled to the inputs of the additional multiplexers.

10. The integrated circuit of claim 1, wherein the buffer circuit is a configurable circular first-in first-out (FIFO) circuit.

11. The integrated circuit of claim 1, wherein the buffer circuit is operable in a configuration mode for loading new configuration data into the plurality of logic regions and an unloading mode for offloading the configuration data to the external pins.

12. A method of operating an integrated circuit, the method comprising:
with a secure device manager, receiving an unload command;
in response to receiving the unload command, using the secure device manager to configure unloading circuitry such that a buffer circuit in the unloading circuitry is coupled to external pins;
synchronously offloading data from a plurality of logic sectors to the external pins via the buffer circuit;
dividing the buffer circuit into multiple partitions; and
with the partitions of the buffer circuit, receiving data from the plurality of logic sectors in parallel.

13. The method of claim 12, further comprising configuring the buffer circuit as an output first-in first-out (FIFO) circuit when offloading the data.

14. The method of claim 13, further comprising configuring the buffer circuit as an input FIFO circuit for receiving data to be loaded into the plurality of logic sectors.

15. The method of claim 12, further comprising:
in response to determining that one of the partitions is full, directing the plurality of logic sectors to send data to another one of the partitions; and
in response to determining that one of the partitions is empty, directing the buffer circuit to unload data from another one of the partitions.

16. A non-transitory computer-readable storage medium comprising instructions for:
configuring a set of multiplexers so that a buffer circuit is coupled to external pins;
dividing the buffer circuit into multiple partitions; and
directing a plurality of local sector managers to offload configuration data to the external pins via the buffer circuit, wherein the local sector managers offload the configuration data to the multiple partitions of the buffer circuit in parallel.

17. The non-transitory computer-readable storage medium of claim 16, further comprising instructions for:
receiving a Joint Test Action Group (JTAG) read request command.

18. The non-transitory computer-readable storage medium of claim 16, further comprising instructions for:
directing a first selected local sector manager in a first group of the local sector managers to send its configuration data to one of the multiple partitions via a first data bus; and
directing a second selected local sector manager in a second group of the local sector managers to send its configuration data to another one of the multiple partitions via a second data bus that is different than the first data bus.

19. The non-transitory computer-readable storage medium of claim 18, further comprising instructions for:
directing additional multiplexers to route the configuration data from the first and second data buses to the corresponding partitions in the buffer circuit.

20. The non-transitory computer-readable storage medium of claim 16, further comprising instructions for:
configuring the buffer circuit as an input first-in first-out (FIFO) circuit in a configuration mode for loading new configuration data into the plurality of local sector managers; and
configuring the buffer circuit as an output first-in first-out (FIFO) circuit in an unloading mode during which the plurality of local sector managers offload the configuration data to the external pins via the buffer circuit.

* * * * *